(12) United States Patent
Saketi (10) Patent No.: US 11,076,519 B1
(45) Date of Patent: Jul. 27, 2021

(54) SELECTIVE INKING HEAD FOR SEMICONDUCTOR DEVICES

(71) Applicant: Facebook Technologies, LLC, Menlo Park, CA (US)

(72) Inventor: Pooya Saketi, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 185 days.

(21) Appl. No.: 16/370,770

(22) Filed: Mar. 29, 2019

Related U.S. Application Data (60) Provisional application No. 62/650,911, filed on Mar. 30, 2018.

(51) Int. Cl.
| | |
|---|---|
| *H05K 3/30* | (2006.01) |
| *H05K 13/04* | (2006.01) |
| *H01L 33/00* | (2010.01) |
| *H05K 13/08* | (2006.01) |

(52) U.S. Cl.
CPC ....... *H05K 13/0469* (2013.01); *H01L 33/005* (2013.01); *H05K 13/0406* (2018.08); *H05K 13/0408* (2013.01); *H05K 13/0411* (2018.08); *H05K 13/0812* (2018.08); *H05K 13/0815* (2018.08)

(58) Field of Classification Search
CPC ........... H05K 13/0469; H05K 13/0408; H05K 13/0411; H05K 13/0406; H05K 13/0815; H05K 13/0812; H01L 33/005; Y10T 29/4913

USPC .................................................. 29/830, 832
See application file for complete search history.

(56) References Cited

U.S. PATENT DOCUMENTS

| | | | | |
|---|---|---|---|---|
| 5,206,749 A | * | 4/1993 | Zavracky | .......... H01L 29/78654 349/45 |
| 9,773,750 B2 | * | 9/2017 | Bibl | ........................ H01L 24/83 |
| 10,453,711 B2 | * | 10/2019 | Goward | ............. H01L 21/67092 |
| 10,490,525 B1 | * | 11/2019 | Chen | ........................ H01L 24/94 |
| 2005/0133954 A1 | * | 6/2005 | Homola | ................. G03F 7/0002 264/219 |

\* cited by examiner

*Primary Examiner* — Donghai D Nguyen
(74) *Attorney, Agent, or Firm* — Fenwick & West LLP (57) ABSTRACT

A method and system for manufacturing a device by forming a conformable interface layer from elastomer solution on semiconductor devices to facilitate picking and placing the semiconductor devices from a carrier substrate to a target substrate. The method may include transferring elastomer solution onto fluidic tips of a subset of fluidic heads of a fluidic head array by extending one or more fluidic head actuators of the subset of the fluidic heads, transferring the elastomer solution on the fluidic tips of the subset of the fluidic heads to semiconductor devices on a carrier substrate to form conformable interface layers on the semiconductor devices, and picking up the semiconductor devices via adhesive attachment with the conformable interface layers from the carrier substrate to place on a target substrate.

10 Claims, 9 Drawing Sheets

SELECTIVE INKING HEAD FOR SEMICONDUCTOR DEVICES

CROSS REFERENCE TO RELATED APPLICATION

The application claims the benefit of U.S. Provisional Patent Application No. 62/650,911, filed Mar. 30, 2018, which is incorporated by reference in its entirety.

BACKGROUND

The present disclosure relates to manufacture of small display elements that are transferred from an initial substrate to a receiving substrate using a pick and place transfer process.

To populate a display with very small light emitting diodes (LEDs), such as micro-LEDs (μLEDs), there may be a need to transfer the LEDs from a native substrate on which they have been manufactured or a temporary carrier substrate to a target substrate that forms part of the display, or "display substrate." Such small semiconductor devices may be assembled with a defined separation distance between them or closely packed together on the target substrate. Because of the small size of these devices (e.g., diameter or width smaller than 100 μm), conventional pick and place techniques are unsuitable.

SUMMARY

Embodiments relate to using a fluidic head array with selectable fluidic heads to transfer elastomer solution onto semiconductor devices, the elastomer solution forming conformable interface layers on the semiconductor devices to facilitate adhesive pick and place of the semiconductor devices onto a target substrate. Elastomer solution is transferred onto fluidic tips of a subset of fluidic heads of a fluidic head array by extending one or more fluidic head actuators of the subset of the fluidic heads. The elastomer solution on the fluidic tips of the fluidic heads is transferred to semiconductor devices on a carrier substrate to form conformable interface layers on the semiconductor devices. The semiconductor devices are picked up via adhesive attachment with the conformable interface layers from the carrier substrate, and the semiconductor devices are placed on a target substrate.

In some embodiments, the fluidic head actuator of each of the fluidic heads includes a piezo layer. A voltage is applied to the fluidic head actuator in a direction of polarization the piezo layer to extend the fluidic head actuator.

A system for manufacturing an electronic display or other device includes a fluidic head array including a plurality of fluidic heads. Each fluidic head includes a fluidic head actuator configured to transition from a shortened state to a lengthened state in response to a voltage applied to the fluidic head actuator, and a fluidic tip extending from the fluidic head actuator, the fluidic tip being adhesive for an elastomer solution.

A non-transitory computer readable medium stores instructions that when executed by a processor cause the processor to: transfer elastomer solution onto fluidic tips of a subset of fluidic heads of a fluidic head array towards the elastomeric solution by extending one or more fluidic head actuators of the subset of the fluidic heads; transfer the elastomer solution on the fluidic tips of the subset of the fluidic heads to semiconductor devices on a carrier substrate to form conformable interface layers on the semiconductor devices; and pick up the semiconductor devices via adhesive attachment with the conformable interface layers from the carrier substrate; and place the semiconductor devices on a display substrate of the electronic display including a control circuit for the semiconductor devices.

The figures depict embodiments of the present disclosure for purposes of illustration only.

DETAILED DESCRIPTION

Embodiments relate to manufacturing a device by forming a conformable interface layer from elastomer solution on semiconductor devices to facilitate picking and placing the semiconductor devices from a carrier substrate to a target substrate using a fluidic head array. The fluidic head array may include an array of individual fluidic heads that can be selectively controlled to change length, such as to transition from a shortened state to a lengthened state. Fluidic heads transitioned to the lengthened state pick up the elastomer solution, and then place the elastomer solution onto the semiconductor devices where the elastomer solution forms the conformable interface layers. After formation of the conformable interface layers, a pick-up head array or the like picks up and places the semiconductor devices from the carrier substrate to a target substrate (e.g., a display substrate of an electronic display). In some embodiments, each fluidic head includes a fluidic head actuator including one or more piezo layers that change in length according to an applied voltage, and the fluidic tip extending from the fluidic head actuator.

Among other things, the fluidic head array provides for the parallel formation of conformable interface layers on a portion or subset of the semiconductor devices on the carrier substrate. These semiconductor devices may then be picked and placed via adhesive attachment with the conformable interface layers to efficiently populate sub-pixels of pixels of a display device. Other semiconductor devices that do not have the conformable interface layer are not adhesive and remain on the carrier substrate, such as for placement onto the target substrate or a different target substrate in another placement cycle. Thus, the fluidic head array provides selective picking and placing for small semiconductor devices from a carrier substrate to a target substrate.

System Overview

Figure 1:
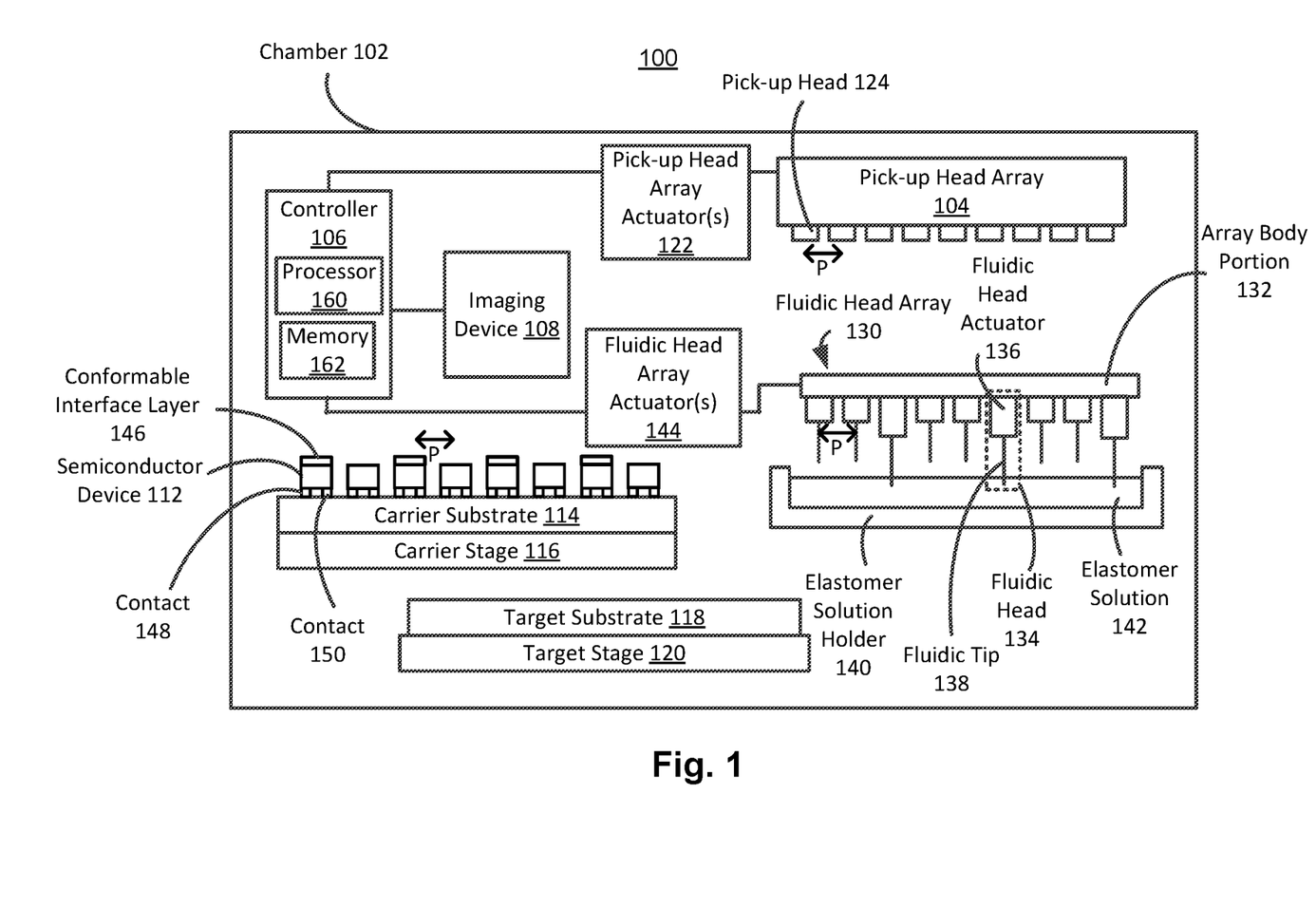
FIG. 1 is schematic diagram illustrating a display assembly system, in accordance with one embodiment.

FIG. 1 is a block diagram illustrating a display assembly system 100, in accordance one embodiment. The system 100 fabricates a display device by assembling semiconductor devices 112 from a carrier substrate 114 to a target substrate 118. In some embodiments, the semiconductor devices 112 are different color light emitting diodes (LEDs). The carrier substrate 114 may be a temporary carrier that holds the semiconductor devices 112 for pick up by the pick-up head array. The target substrate 118 may be a display substrate of a display device including control circuits for the LEDs. The system 100 places LEDs at pixel locations of the display substrate, and then bonds the LEDs to the display substrate. In some embodiments, the semiconductor devices 112 are μLEDs having a diameter or width smaller than 100 μm, a reduced divergence of light output, and small light emitting area. In other embodiments, the semiconductor devices 112 are vertical-cavity surface-emitting lasers (VCSELs).

The system 100 may include, among other components, a chamber 102 defining an interior environment for picking and placing semiconductor devices 112 within the chamber 102. The system 100 further includes a pick-up head array 104, a controller 106, an imaging device 108, a pick-up head array actuator 122, a fluidic head array 130, an elastomer solution holder 140 holding elastomer solution 142, a fluidic head array actuator 144, a carrier stage 116, and a target stage 120.

The carrier stage 116 holds a carrier substrate 114 having semiconductor devices 112. The target stage 120 holds a target substrate 118 to receive some or all of the semiconductor devices 112 from the carrier substrate 114. The controller 106 is coupled to the imaging device 108, the pick-up head array 104 via the pick-up head array actuator 122, and the fluidic head array 130 via the fluidic head array actuator 144, and controls the operation of these components. For example, the controller 106 causes the fluidic head array 130 to pick up elastomer solution 142 from the elastomer solution holder 140, and to place the elastomer solution 142 onto the semiconductor devices 112 to form conformable interface layers 146 on the semiconductor devices 112. The controller 106 further causes the pick-up head array 104 to pick up one or more semiconductor devices 112 located on a carrier substrate 114 via adhesive attachment with the conformable interface layers 146 on the semiconductor devices 112, and place the one or more semiconductor devices on the target substrate 118. In some embodiments, the controller includes a processor 160 and a memory 162. The memory 162 may be a non-transitory computer-readable storage medium storing instructions that when executed by the processor 160 causes the processor 160 to perform the functionality discussed herein, such as by controlling the other components of the system 100. In some embodiments, the controller 106 may include an application specific integrated circuit (ASIC), field programmable gate array (FPGA), or other type of processing circuitry.

The fluidic head array 130 includes an array body portion 132 that is attached with a plurality of fluidic heads 134. Each fluidic head 134 includes a fluidic head actuator 136 and a fluidic tip 138 attached to an end of the fluidic head actuator 136. Each fluidic actuator 136 has an adjustable length, and may be transitioned between shortened and lengthened states to selectively pick up the elastomer solution 142 with an attached fluidic tip 138. In some embodiments, each fluidic head actuator 136 is a piezo actuator including one or more piezo layers, and having an adjustable length that is controlled by an applied voltage to each of the piezo layers.

One or more of the fluidic heads 134 may be selectively placed in a lengthened state, such as via control signals from the controller 106, to pick up the elastomer solution 142. Other non-selected fluidic heads 134 may be placed or kept in a shortened state such these fluidic heads 134 do not pick up the elastomer solution 142. The fluidic heads 134 of the fluidic head array 130 may be separated by a pitch P that corresponds with the pitch P of the semiconductor devices 112 on the carrier substrate 114. In another example, the fluidic heads 134 may be separated by a multiple of the pitch P of the semiconductor devices 112. As such, the fluidic head array 130 can support parallel placement of the conformable interface layer 146 on selected semiconductor devices 112.

The fluidic head array actuator 144 is an electro-mechanical component that causes movement of the fluidic head array 130, such as in response to control signals from the controller 106. For example, the fluidic head actuator 144 may align the fluidic head array 130 with the elastomer solution holder 140 such that lengthened fluidic heads 134 are in contact with the elastomer solution 142 while shortened fluidic heads 134 are not in contact with the elastomer solution. The fluidic head array actuator 144 may further move the fluidic head array 130 away from the elastomer solution holder 140 and toward the semiconductor devices 112 on the carrier substrate 114, and align the fluidic head array 130 with the semiconductor devices 112 on the carrier substrate 114 to place elastomer solution 142 attached to the selected fluidic heads 134 onto selected semiconductor devices 112 to form the conformable interface layers 146. In some embodiments, the fluidic head array actuator 144 moves the fluidic head array 130 with multiple degrees of freedom (DoF) to support the alignments and movements of the fluidic head array 130. For example, the fluidic head array actuator 144 may move the fluidic head array 130 with three degrees of freedom including up and down, left and right, and forward and back. In another example, the fluidic head array actuator 144 moves the fluidic head array with six degrees of freedom. In some embodiments, fluidic head array actuator 144 may include a rotating motor, a linear motor, and/or a hydraulic cylinder.

The elastomer solution 142 may include elastomeric material, such as Polydimethylsiloxane (PDMS), Polyurethane (PU), or some other polymer. The elastomeric material may be a polymer with viscoelasticity (having both viscosity and elasticity). The elastomeric material may also have weak inter-molecular forces, a low Young's modulus, and/or high failure strain compared with other materials. In some embodiments, other types of adhesive material that is capable of forming the conformable interface layers 146 may be used including non-elastomer materials.

The pick-up head array 104 includes a plurality of pick-up heads 124. Each pick-up head 124 can pick up a semiconductor device 112 from the carrier substrate 114, and place the semiconductor device 112 on the target substrate 118. In some embodiments, each pick-up head 124 includes a non-conformable tip that adheres with the conformable interface layers 146 on the semiconductor devices 112. The system 100 may include various types of pick-up heads that support selective, parallel placement of multiple LEDs via adhesive attachment with the conformable interface layers 146.

After picking up a semiconductor device 112, the pick-up head 124 is aligned with the target substrate 118 to place the semiconductor device 112 at target locations on the target substrate 118.

The pick-up head array actuator 122 is an electro-mechanical component that controls the movement of the pick-up head array 104 based on control signals from the controller 106. For example, the pick-up head array actuator 122 may move the pick-up head array 104, or individual pick-up heads 124, with three degrees of freedom including up and down, left and right, and forward and back. In another example, the pick-up head array actuator 122 moves the fluidic head array with six degrees of freedom. In some embodiments, the pick-up head array actuator 122 may include a rotating motor, a linear motor, and/or a hydraulic cylinder.

The imaging device 108 facilitates a visual alignment for elastomer solution 142 pick-up and placement, semiconductor device pick-up from the carrier substrate 114, and semiconductor device placement on the target substrate 118. For example, the imaging device 108 generates images of the fluidic head array 130 and the elastomer solution holder 140, and provides the images to the controller 106. The controller 106 aligns the fluidic heads 134 with the elastomer solution 142 or elastomer solution holder 140 based on the images. In another example, the imaging device generates images of the fluidic head array 130 and the carrier substrate 114 and/or semiconductor devices 112 on the carrier substrate 114, and the controller aligns the fluidic heads 134 with the semiconductor devices 112 to place the conformable interface layers 146.

Furthermore, the imaging device 108 generates images of the pick-up head array 104 and the carrier substrate 114, and provides the images to the controller 106. The controller 106 aligns the one or more pick-up heads 124 of the pick-up head array 104 with the carrier substrate 114 based on the images, and picks up one or more semiconductor devices 112 mounted on the carrier substrate 114. In another example, the imaging device 108 generates images of the one or more pick-up heads 124 of the pick-up head array 104 and the target substrate 118, and provides the images to the controller 106. The controller 106 aligns the one or more pick-up heads 124 with the display substrate 118 based on the images, and places the semiconductor devices 112 attached to the one or more pick-up heads 124 on the display substrate 118.

In some embodiments, the imaging device 108 is an environmental scanning electron microscope (ESEM) to provide images without specimen coating. The chamber 102 is an ESEM chamber including a high pressure atmosphere of water vapor. The use of an SEM is advantageous for providing visualization in connection with picking and place small semiconductor device, such as μLEDs. In various embodiments, other types of imaging devices may be used to facilitate the alignments. In some embodiments, the system 100 may include multiple imaging devices, such as an imaging device pointed at the carrier substrate 114, an imaging device pointed at the target substrate 118, and/or an imaging device pointed at the elastomer solution holder 140.

In some embodiments, the carrier stage 116 and/or target stage 120 may be adjusted to facilitate precision alignment with the pick-up head array 104. For example, the carrier stage 116 and/or target stage 120 may include three degrees of freedom. The degrees of freedom may include left and right, backward and forward, and a yaw rotational degree of freedom. The carrier substrate 114 is moved with the carrier stage 116, and the display substrate 118 is moved with the target stage 120.

The system 100 may include one or more carrier substrates 114. For example, different carrier substrates 114 may carry different color LEDs. A carrier substrate 114 may hold singulated semiconductor devices 112 for transfer to the display substrate 118. The system 100 may further include one or more target substrates 118. In some embodiments, such as when the target substrate 118 is a display substrate for receiving the semiconductor devices 112, the target stage 120 includes a heater for thermal compression (TC) bonding of electrical contacts 148 and 150 of the semiconductor devices 112 to the display substrate 118 subsequent to placement of the semiconductor devices 112 on the display substrate 118 by the pick-up head array 104.

In some embodiments, the system 100 includes up/down inspection cameras. Alternatively, for the higher accuracy, the fluidic head array 130 and/or pick-up head array 104 may be mounted to a modified wafer aligner. For nano-placement accuracy, a smaller working/movement distance may be advantageous. In some embodiments, the fluidic head array 130 and pick-up head array 104 provides a massively parallel pick and place operation, reducing the time for assembly and therefore reducing manufacturing costs.

In some embodiments, the system 100 includes multiple pick-up head arrays 104 each positioned at a separate station. Each station may be dedicated to the pick and place of a particular color LED, such as a green station for green LEDs, a red station for red LEDs, and a blue station for blue LEDs, etc. In some embodiments, the system 100 may similarly include multiple fluidic head arrays 130.

In some embodiments, the semiconductor devices 112 are singulated on the carrier substrate 114, such as by a laser or mechanical dicer, or via an etching process. Multiple semiconductor devices 112 may be fabricated on a native substrate and singulated on the carrier substrate 114. In some embodiments, a laser beam is directed through the carrier substrate 114 to perform the singulation. In some embodiments, the carrier substrate 114 includes a carrier tape or other adhesive layer to hold the semiconductor devices 112 in place with an adhesion force. A laser beam or other treatment reduces the adhesion force to facilitate pick up of the semiconductor devices 112 by the pick-up head array 104 via adhesion with the conformable interface layers 146.

Figure 2A:
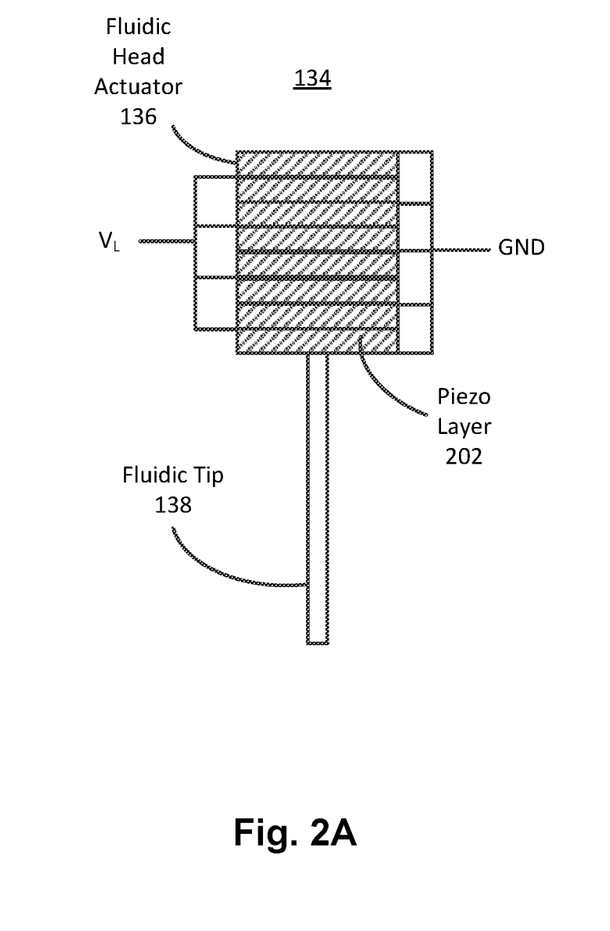
FIG. 2A is a schematic diagram illustrating a cross-sectional view of a shortened state of a fluidic head of a fluidic head array, in accordance with one embodiment.

FIG. 2A is a schematic diagram illustrating a cross-sectional view of a shortened state of a fluidic head 134 of a fluidic head array 130, in accordance with one embodiment. The fluidic head 134 includes the fluidic head actuator 136 attached with the fluidic tip 138. The fluidic head actuator 136 includes one or more piezo layers 202. For example, the fluidic head actuator 136 may include a single piezo layer 202, or multiple piezo layers 202 stacked on top of each other. Each piezo layer 202 includes a first side coupled to a variable control voltage and a second side coupled to ground. When the variable control voltage is a low voltage $V_L$, such as 0 volts or the ground voltage, then the piezo layer 202 is in a shortened state, resulting in the fluidic head actuator 136 being in the shortened state.

Figure 2B:
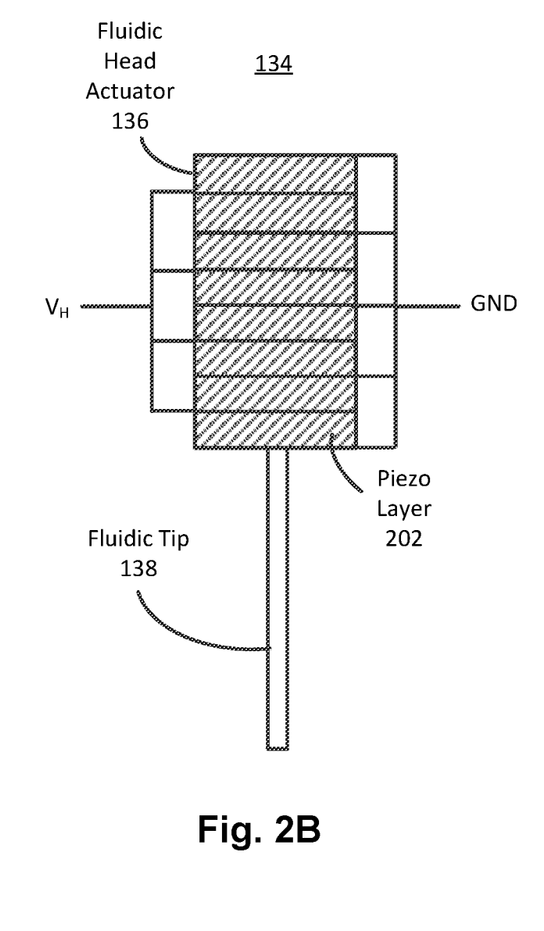
FIG. 2B is a schematic diagram illustrating a cross-sectional view of a lengthened state of a fluidic head of a fluidic head array, in accordance with one embodiment.

FIG. 2B is a schematic diagram illustrating a cross-sectional view of a lengthened state of the fluidic head 134 of the fluidic head array 130, in accordance with one embodiment. The length of the fluidic head actuator 136 varies as a function of the variable control voltage. When the variable control voltage is a high voltage $V_H$ (e.g., higher than $V_L$ and/or ground), a displacement is created in the direction of the polarization of the one or more piezo layers

202. As such, the one or more piezo layers 202 are transition to a lengthened state, resulting in the fluidic head actuator 136 being in the lengthened state. In the lengthened state, the length of the fluidic head actuator 136 is longer than the length of the fluidic head actuator 136 in the shortened state.

As discussed above in connection with FIG. 1, a portion of the fluidic head actuators 136 of the fluidic head array 130 may be selectively placed in the lengthened state to pick up the elastomer solution 142 with their fluidic tips 138, while another portion of the fluidic head actuators 136 may be in the shortened state to avoid picking up the elastomer solution with their fluidic tips.

Figure 2C:
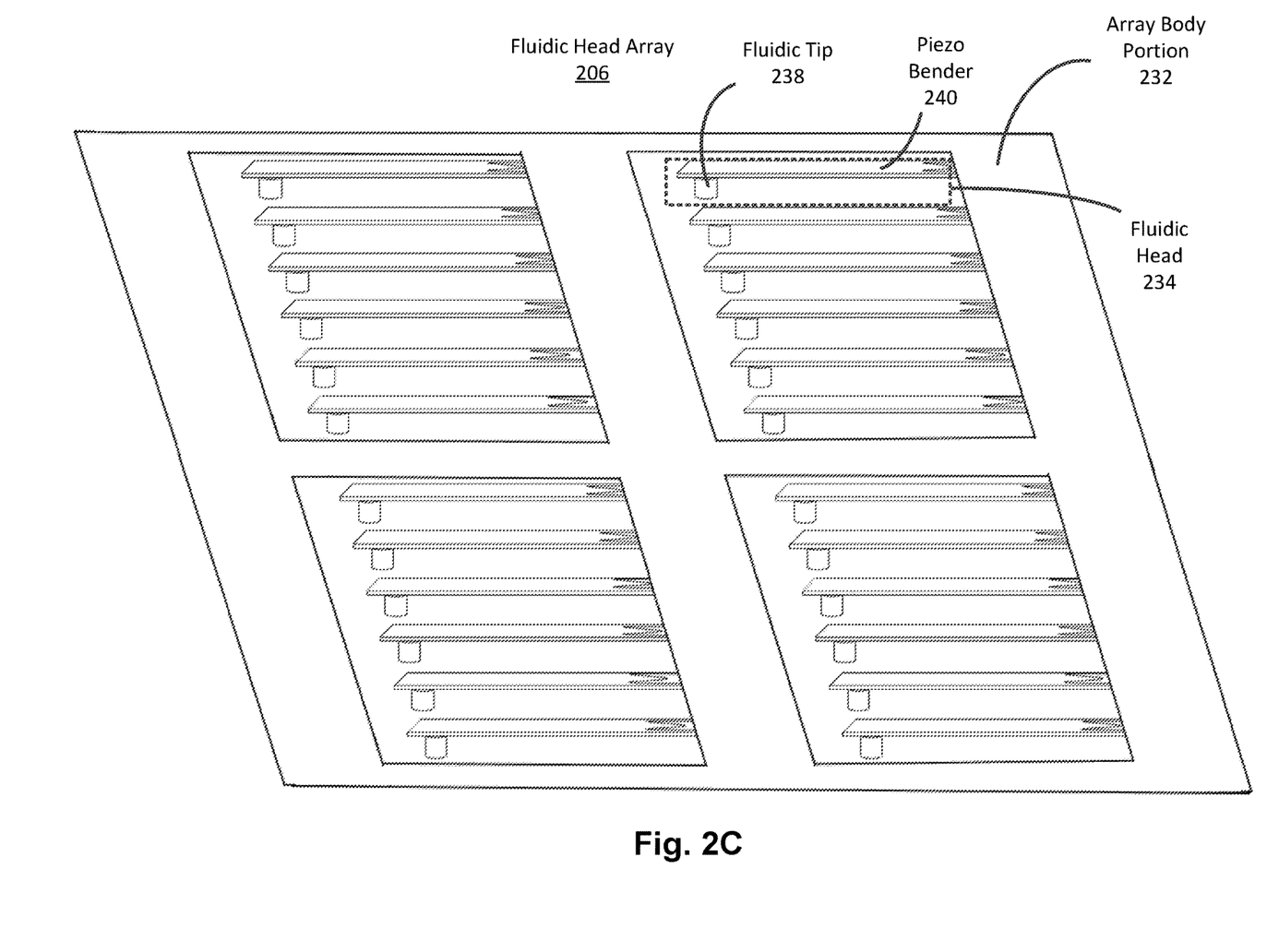
FIG. 2C is a schematic diagram illustrating a fluidic head array including piezo benders with a cantilever architecture, in accordance with one embodiment.

FIG. 2C is a schematic diagram illustrating a fluidic head array 206 including piezo benders 240 with a cantilever architecture, in accordance with one embodiment. The fluidic head array 206 includes an array body portion 232 attached to fluidic heads 234. Each fluidic head 234 includes a piezo bender 240 and a fluidic tip 238. A first end of the piezo bender 240 is attached to the array body portion 232 and the fluidic tip 238 is located at a second end of the piezo bender 240. In response to an applied voltage, the piezo bender 240 bends to lower the fluidic tip 238. Each of the fluidic heads 234 may be individually addressable. In some embodiments, piezo benders are used for an application which is low force (e.g., 10s of nN-10s of mN) and large displacement (e.g., 100 nm-few mm). In contrast, a piezo stack may be used in high force (e.g., 10s of Newtons) and small displacement e.g., (less than 200 nm) applications.

Figure 2D:
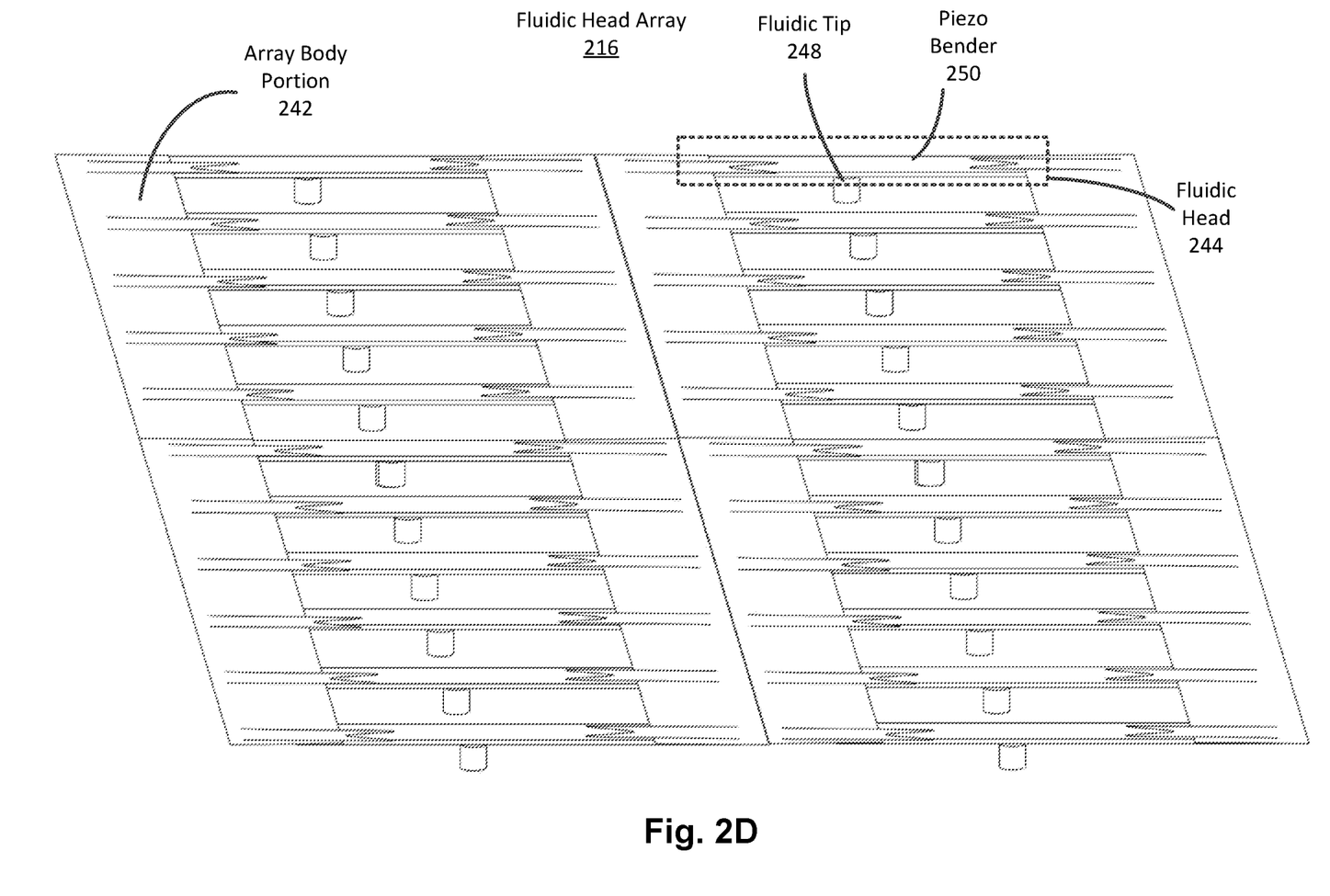
FIG. 2D is a schematic diagram illustrating a fluidic head array including piezo benders with a fixed-beam architecture, in accordance with one embodiment.

FIG. 2D is a schematic diagram illustrating a fluidic head array 216 including piezo benders 250 with a fixed-beam architecture, in accordance with one embodiment. The fluidic head array 216 includes an array body portion 242 attached to fluidic heads 244. Each fluidic head 244 includes a piezo bender 250 and a fluidic tip 248. A first and second end of the piezo bender 250 is attached to the array body portion 242 and the fluidic tip 248 on the piezo bender 250 between the first and second ends, such as at the middle of the piezo bender 250. In response to an applied voltage, the piezo bender 250 bends to lower the fluidic tip 248. Each of the fluidic heads 244 may be individually addressable.

Figure 3:
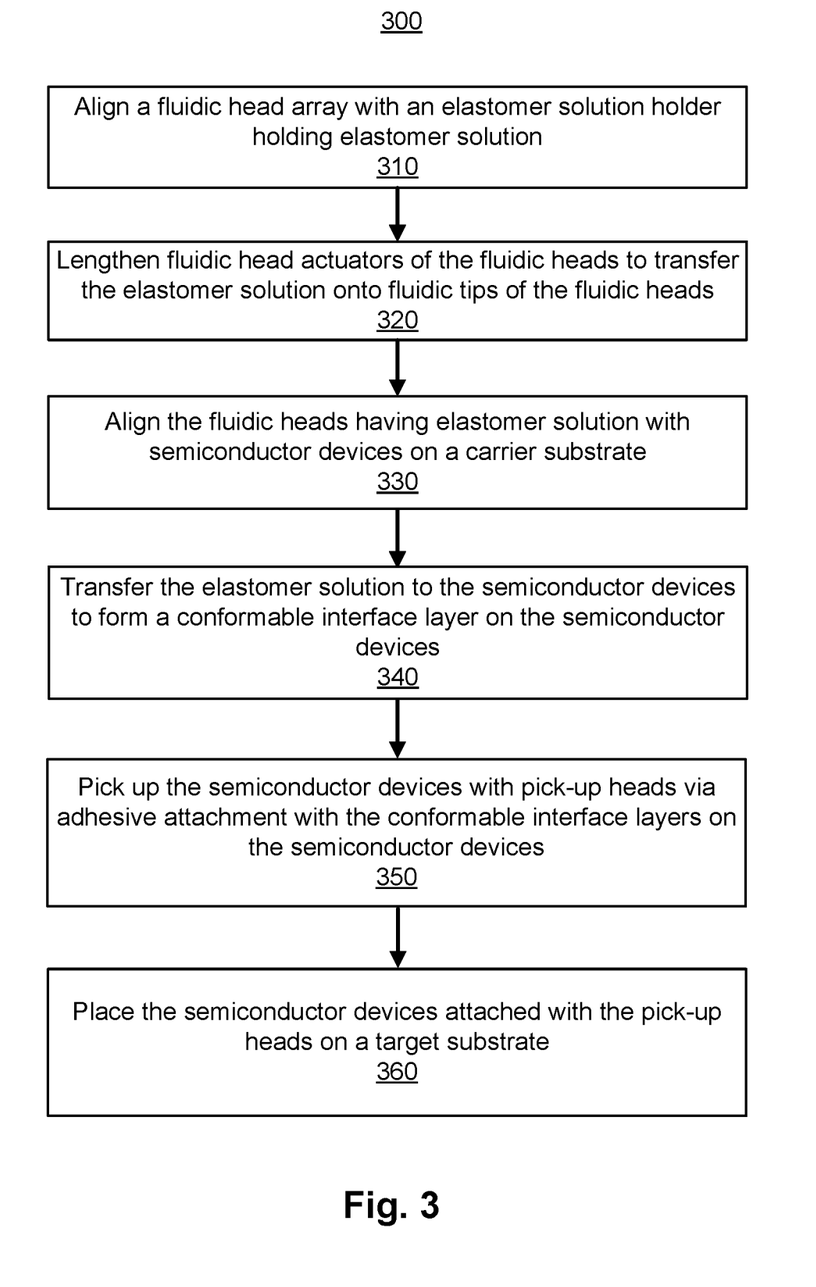
FIG. 3 is a flowchart illustrating a process for forming conformable interface layers on semiconductor devices to facilitate picking and placing of the semiconductor devices, in accordance with one embodiment.

FIG. 3 is a flowchart illustrating a process 300 for forming conformable interface layers on semiconductor devices to facilitate picking and placing of the semiconductor devices, in accordance with one embodiment. The process 300 is discussed with reference to FIGS. 4A through 4F, which are schematic diagrams illustrating the forming of conformable interface layers 146 on semiconductor devices 112 and the picking and placing of the semiconductor devices 112, in accordance with one embodiment. The process 300 may include different and/or additional steps, or some steps may be in different orders.

A fluidic head array is aligned 310 with an elastomer solution holder holding elastomer solution. The fluidic head array actuator 144, under control of the controller 106 using the imaging device 108 for reference, may move the fluidic head array 130 over the elastomer solution 142 in the elastomer solution holder 140. In connection with the alignment, the fluidic head array 130 may further be placed in proximity to the elastomer solution holder 140, such as by lowering of the fluidic head array 130 toward the elastomer solution holder 140.

The fluidic head actuators of at least a portion of the fluidic heads of the fluidic head array are extended 320 to transfer the elastomer solution onto the fluidic tips of the fluidic heads. For example, the fluidic head actuators 136 may initially be in a shortened state (e.g., a rest state of the one or more piezo layers 202 with $V_L=0$ V) as shown in FIG. 2A, and then transitioned to the lengthened state as shown in FIG. 2B by applying a high voltage (e.g., $V_H$ greater than $V_L$ and GND) to the fluidic head actuators 136.

Figure 4A:
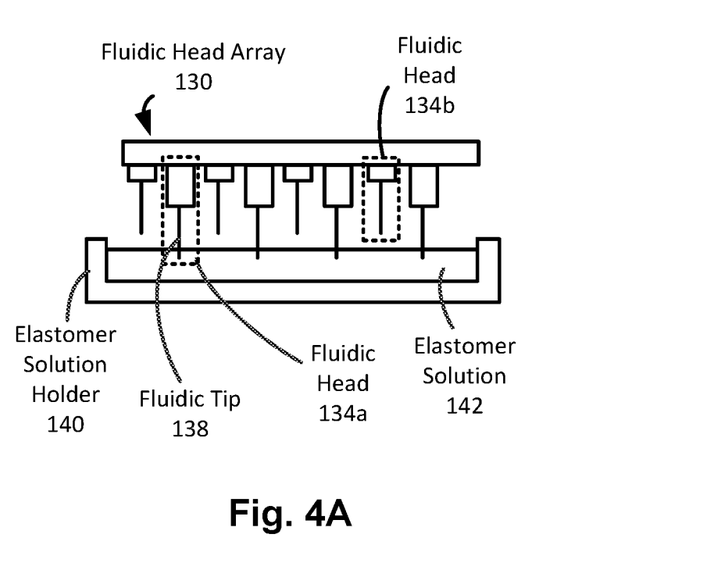
FIGS. 4A, 4B, 4C, 4D, 4E, and 4F are schematic diagrams illustrating the forming of conformable interface layers on semiconductor devices and the picking and placing of the semiconductor devices, in accordance with one embodiment.
Figure 4B:
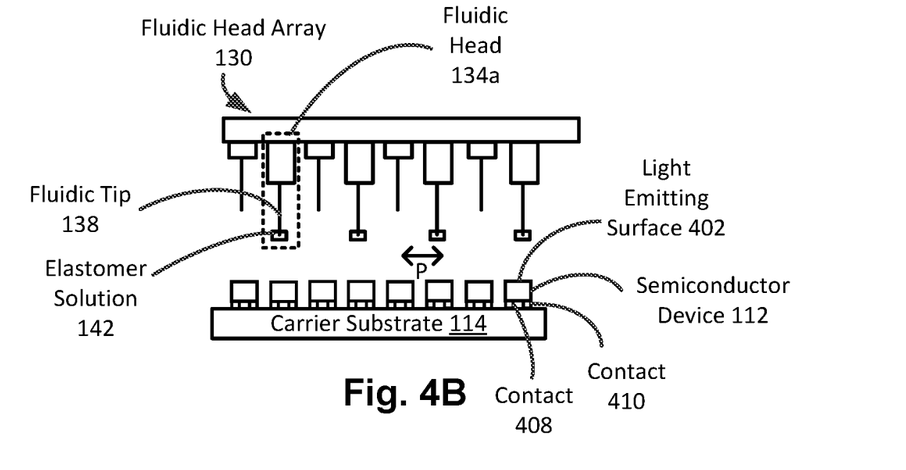

With reference to FIG. 4A, a portion of the fluidic heads 134 (e.g., fluidic head 134a) may be selected to pick up the elastomer solution 142 with their fluidic tips 138 and are in the lengthened state accordingly, while another portion of the fluidic heads 134 (e.g., fluidic head 134b) are not selected and are in the shortened state. Via the lengthening of fluidic head actuators 136 of selected fluidic heads 134a, the fluidic tips 138 are placed into contact with the elastomer solution 142 within the elastomer solution holder 140. A portion of the elastomer solution 142 adheres to each of these fluidic tips 138, as shown in FIG. 4B.

The fluidic heads having elastomer solution are aligned 330 with semiconductor devices on a carrier substrate. The fluidic head array actuator 144, under control of the controller 106 using the imaging device 108 for reference, may move the fluidic head array 130 having the elastomer solution 142 away from the elastomer solution holder 140 and over the semiconductor devices 112 on the carrier substrate 114. With reference to FIG. 4B, the fluidic heads 134 may be separated by the same pitch P as the semiconductor devices 112. A portion of the semiconductor devices 112 on the carrier substrate 114 may be selected to receive the elastomer solution 142, and the fluidic head array 130 is aligned accordingly.

Figure 4C:
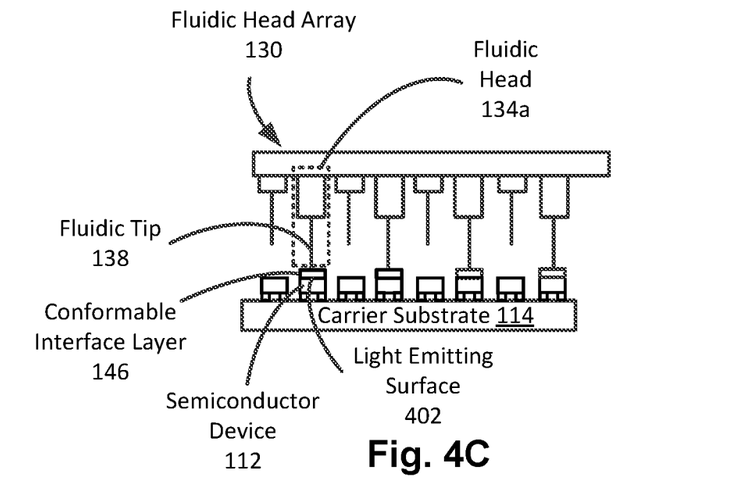

The elastomer solution is transferred 340 from the fluidic heads to the semiconductor devices to form a conformable interface layer on the semiconductor devices. With reference to FIG. 4C, the fluidic tips 138 having elastomer solution are placed in contact with semiconductor devices 112 on the carrier substrate 114, causing the elastomer solution to be transferred onto the semiconductor devices 112. The transferred elastomer solution forms the conformable interface layers 146 on a surface of the semiconductor devices 112, such as the light emitting surface 402. Subsequent to transferring the elastomer solution 142, the fluidic head array 130 may be lifted away from the semiconductor devices 112. The number of semiconductor devices 112 that receive the conformable interface layer 146 in one placement by the fluidic head array 130 may vary.

Figure 4D:
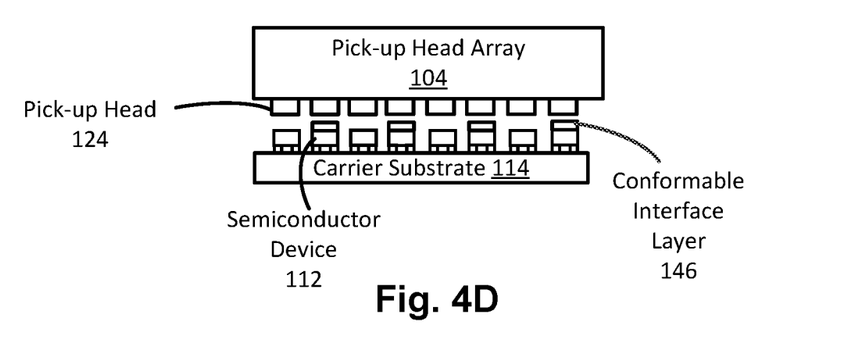

The semiconductor devices are picked up 350 with a pick-up heads of a pick-up head array via adhesive attachment of the pick-up heads with the conformable interface layers on the semiconductor devices. With reference to FIG. 4D, selected pick-up heads 124 of the peak-up head array 104 may be aligned with the semiconductor devices 112 including conformable interface layer 146. The conformable interface layers 146 attaches with the pick-up heads 124 via adhesive attachment.

Figure 4E:
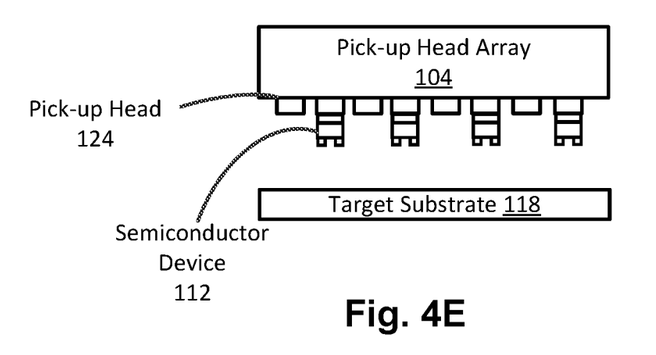

The semiconductor devices attached with the pick-up heads are placed 360 on a target substrate. With reference to FIG. 4E, the pick-up head array 104 with attached semiconductor devices 112 may be lifted away from the carrier substrate and aligned with target locations on the target substrate 118. The target locations may be separated by the same pitch P as the pitch P between adjacent pick-up heads 124 of the pick-up head array 104. Although not shown in FIG. 4E, the target substrate 118 may include previously placed semiconductor devices, such as from a prior pick and place process.

Figure 4F:
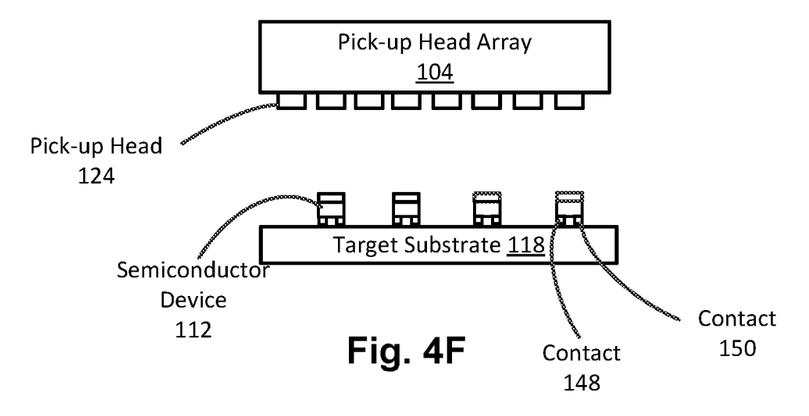

With reference to FIG. 4F, the semiconductor devices 112 are placed on the target substrate 118, and the pick-up head array 104 may be lifted from the target substrate 118. In some embodiments, a bonding process may be performed after placement of the semiconductor devices 112 on the target substrate 118. The bonding processes attaches the semiconductor devices 112 to the target substrate 118 (e.g., with a greater force than the adhesive force that attaches the pick-up heads 124 with the conformable interface layers 146), and may also be used to form the electronical connections between the contacts 148, 150 of each semiconductor device 112 and contacts on the target substrate 118. In some embodiments, a TC bonding is performed where the pick-up head array 104 applies a force that pushes the semiconductor devices against the target substrate 118 in connection with an application of heat (e.g., by a heater in the target stage 120). In some embodiments, the bonding process may include reflow of a low temperature solder alloy between the contacts of the semiconductor devices 112 and the target substrate 118 such as tin-silver (SnAg) or copper-tin (CuSn).

In some embodiments, the conformable interface layers 146 are removed from the light emitting surfaces of the semiconductor devices 112 after placement onto the target substrate 118. In other embodiments, the conformable interface layers 146 may be kept on the light emitting surfaces. For example, if the conformable interface layers 146 are transparent or substantially transparent for light emitted from the light emitting surfaces, then a removal step can be avoided. In another example, the conformable interface layers 146 may form a lens or other optical component that enhances the collimation of output light. In another example, the elastomer material and conformable interface layers 146 may include color converting material that changes the wavelength of light emitted from the light emitting surfaces.

The process 300 as illustrated in FIG. 3 is merely illustrative and various changes can be made to the process. For example, the semiconductor devices may be picked and placed with other types of pick-up heads or pick-up head arrays. The process 300 may be repeated. For example, the system 100 may include multiple carrier substrates each holding LEDs of different color. In each placement cycle defined by the process 300, different color LEDs may be transferred from their carrier substrate to the display substrate. Multiple placement cycles of the LEDS may be used to place the LEDs of different color from the carrier substrates to the target substrate to manufacture a multi-color (e.g., RGB) electronic display.

µLEDs Examples

Figure 5:
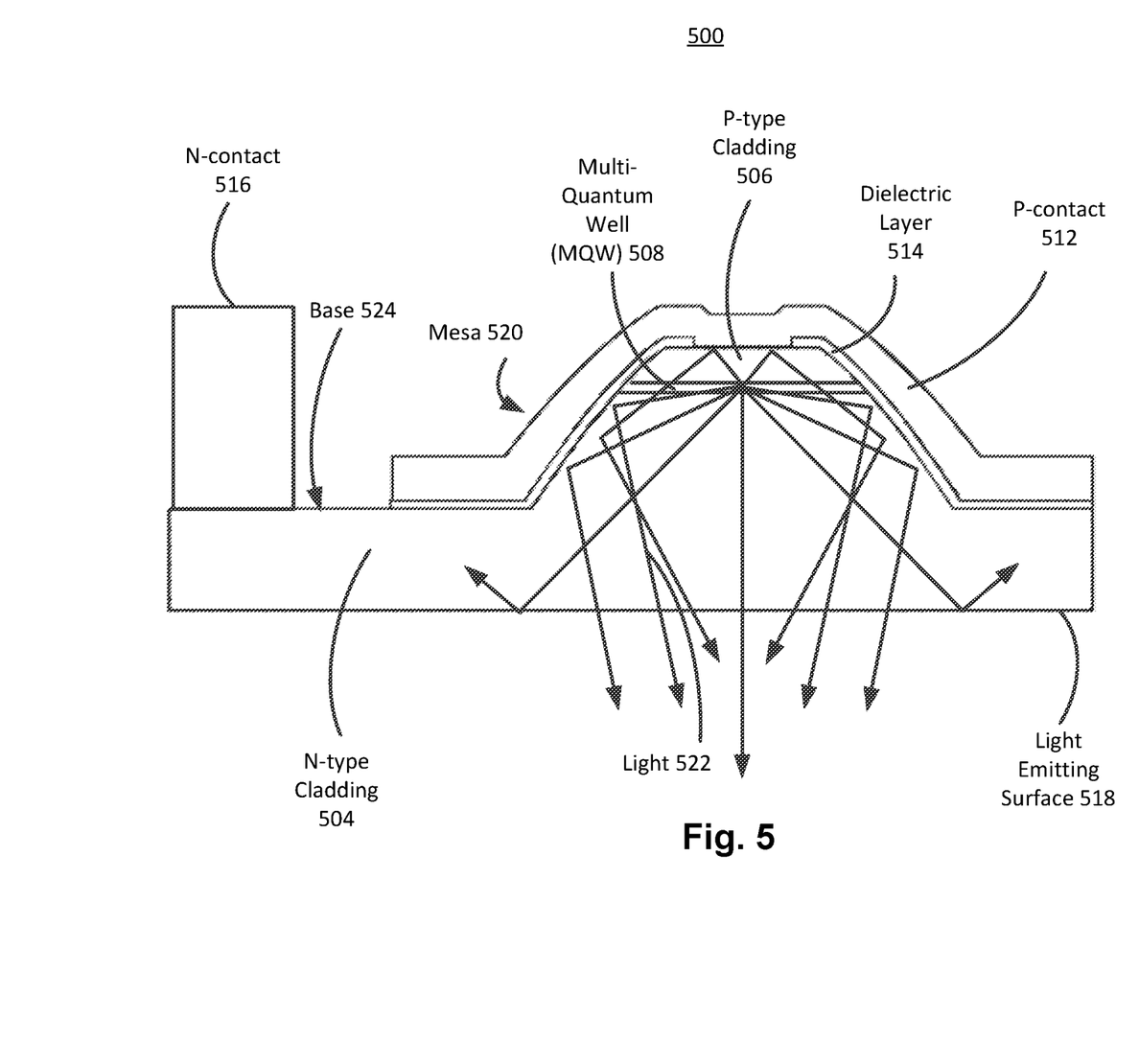
FIG. 5 is a schematic diagram illustrating a cross-sectional view of a μLED, in accordance with one embodiment.

FIG. 5 is a schematic diagram illustrating a cross-sectional view of a µLED 500, in accordance with one embodiment. The µLED 500 is an example of a semiconductor device 112 on which a comfortable interface layer 146 is formed to facilitate pick and place from a carrier substrate 114 to a target substrate 118. The µLED 500 may include, among other components, a semiconductor structure including an n-type cladding 504, a p-type cladding 506, and a multi-quantum well ("MQW") 508 between the n-type cladding 504 and the p-type cladding 506. The µLED 500 further includes a dielectric layer 510 on the semiconductor structure, a p-contact 512 on the dielectric layer 514, and an n-contact 516 on the n-type cladding 504. The semiconductor structure is shaped, such as via an etch process, into a mesa 520 and a base 524 of the mesa 520. The p-type cladding 506 defines the top of the mesa 520, and the n-type cladding 504 defines a portion of the mesa 520 and the base 524. In some embodiments, an n-type cladding defines the top portion of the mesa 520 and a p-type cladding defines the bottom portion of the mesa 520 and the base 524. Here, the p-contact 512 is an n-contact and the n-contact 516 is a p-contact.

The multi-quantum well 508 defines an active light emitting area that is included in the structure of the mesa 520. The µLED 500 may include one or more quantum wells. The mesa 520 may include a truncated top defined on a side opposed to a light emitting surface 518 of the µLED 500. In some embodiments, the semiconductor structure including the n-type cladding 504, MQW 508, and p-type cladding 506 is an epitaxial structure grown on a growth substrate. A conformable interface layer 146 may be formed on the light emitting surface 518 using the fluidic head array 130.

The mesa 520 may include various shapes, such as a parabolic shape with a truncated top, to form a reflective enclosure for light 522 generated within the µLED 500. In other embodiments, the mesa 520 may include a cylindrical shape with a truncated top, or a conic shape with a truncated top, or some other light-collimating shape. The arrows show how the light 522 emitted from the MQW 508 is reflected off the p-contact 512 and internal walls of the mesa 520 toward the light emitting surface 518 at an angle sufficient for the light to escape the µLED 500 (i.e., within a critical angle of total internal reflection). The p-contact 512 and the n-contact 516 are examples of the contacts 148, 150 of the semiconductor device 112, and electrically connect the µLED 500, such as to a display substrate including a control circuit for the µLED 500. The n-contact 516 is formed at the base 524, which is defined by a surface of the n-type cladding 506 opposite the light emitting surface 518. The n-contact 516 may include a conductive material that extends to the top of the mesa 520 to support the placement of the µLED 500 on the display substrate with the p-contact 512 and the n-contact 516 bonded to the display substrate.

The µLED 500 may include an active light emitting area defined by the MQW 508. The µLED 500 directionalizes the light output from the MQW 508 and increases the brightness level of the light output. In particular, the p-contact 512 may be reflective for the light 522 emitted from the MQW 508. The mesa 520 and p-contact 512 cause reflection of the light 522 from the MQW 508 to form a collimated or quasi-collimated light beam emerging from the light emitting surface 518.

The mesa 520 may be formed by etching into the semiconductor structure including the n-type cladding 504, the MQW 508, and the p-type cladding 506, during wafer processing steps. The etching results in the MQW 508 being in the structure of the mesa 520, and at a particular distance to the p-contact 512 to facilitate the collimation of the light 522. In some embodiments, the MQW 508 is at a parabola focal point defined by the parabolic shape of the mesa 520. A portion of the generated light 522 is reflected at the mesa 520 to form the quasi-collimated light beam emitted from the light emitting surface 518.

In some embodiments, the feature size of the µLED 500 (e.g., the diameter) may range from sub-micrometers to tens of micrometers (e.g., from 0.1 µm to 10 µm). The µLED 500 may be one of many µLEDs of an array, with the pitch (e.g., spacing between µLEDs) ranging from sub-micrometers to tens of micrometers.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method, comprising:
    transferring elastomer solution onto fluidic tips of a subset of fluidic heads of a fluidic head array by extending one or more fluidic head actuators of the subset of the fluidic heads;
    transferring the elastomer solution on the fluidic tips of the subset of the fluidic heads to semiconductor devices on a carrier substrate to form conformable interface layers on the semiconductor devices;
    picking up the semiconductor devices via adhesive attachment with the conformable interface layers from the carrier substrate; and
    placing the picked-up semiconductor devices on a target substrate.

2. The method of claim 1, wherein the fluidic head actuator of each of the fluidic heads includes a piezo layer, and a voltage is applied to the fluidic head actuator in a direction of polarization the piezo layer to extend the fluidic head actuator.

3. The method of claim 1, wherein the fluidic head actuator of each of the fluidic heads includes a plurality of stacked piezo layers, and a voltage is applied to across each of the plurality of stacked piezo layers to extend the fluidic head actuator.

4. The method of claim 1, further comprising:
    aligning the fluidic head array with an elastomer solution holder holding the elastomer solution, the fluidic heads each being in a shortened state; and
    causing the subset of the fluidic heads to transition from the shortened state to a lengthened state, wherein the elastomer solution is transferred onto the fluidic tips of the portion of the fluidic heads of the fluidic head array.

5. The method of claim 4, wherein the semiconductor devices on the carrier substrate are separated by a pitch P, and the fluidic heads of the fluidic head array are separated by the pitch P or a multiple of the pitch P.

6. The method of claim 1, wherein the elastomer solution is transferred to a light emitting surface of each of the semiconductor devices.

7. The method of claim 6, wherein each semiconductor device includes:
    a semiconductor structure including:
        a mesa at a first side of the semiconductor structure opposite the light emitting surface at a second side of the semiconductor structure; and
        an active light emitting area in the mesa to generate light; and
    a reflective contact on the mesa.

8. The method of claim 6, wherein each semiconductor device includes:
    a semiconductor structure including:
        the light emitting surface at a first side of the semiconductor structure; and
        an active light emitting to generate light;
    a transparent electrically conductive cap on a second side of the semiconductor structure opposite the first side; and
    a reflective contact on the transparent electrically conductive cap.

9. The method of claim 1, wherein the target substrate is a display substrate including a control circuit for the semiconductor devices.

10. The method of claim 1, wherein the fluidic head actuator of each of the fluidic heads includes a piezo bender.

* * * * *